United States Patent
Roberts

Patent Number: 4,953,222
Date of Patent: Aug. 28, 1990

[54] MULTIPLE CHANNEL GATED AMPLIFIER SYSTEM

[75] Inventor: John H. Roberts, Hickory, Miss.

[73] Assignee: Peavey Electronics Corporation, Meridian, Miss.

[21] Appl. No.: 200,836

[22] Filed: Jun. 1, 1988

[51] Int. Cl.⁵ .............................................. H03G 3/20
[52] U.S. Cl. ........................................ 381/110; 381/81
[58] Field of Search .................... 381/91, 95, 80–82, 381/80, 85, 92, 94, 107, 110; 379/202, 204, 206

[56] References Cited

U.S. PATENT DOCUMENTS

| | | | |
|---|---|---|---|
| 3,814,856 | 6/1974 | Dugan | 381/73.1 |
| 4,090,032 | 5/1978 | Schrader | 381/82 |
| 4,359,062 | 11/1982 | Ponto et al. | 381/81 |
| 4,513,284 | 4/1985 | Right | 381/82 |
| 4,560,838 | 12/1985 | Meisenheimer | 381/81 |
| 4,658,425 | 4/1987 | Julstrom | 381/81 |

*Primary Examiner*—Forester W. Isen
*Attorney, Agent, or Firm*—Watson, Cole, Grindle & Watson

[57] ABSTRACT

A gated multi-channel amplifier system comprises a plurality of musical performance amplification channel means each responsive only to high threshold level sound input for producing amplified sound output, and another channel comprising a vocal/announcer amplifier channel means capable of responding to announcer sound input of both low threshold level and high threshold level for producing an amplified announcer sound output, and means for gating the vocal/announcer amplification channel means to respond to announcer sound input of low threshold signal level only in the absence of response by the other musical performance amplification channel means.

12 Claims, 2 Drawing Sheets

MULTIPLE CHANNEL GATED AMPLIFIER SYSTEM

BACKGROUND AND BRIEF SUMMARY OF THE INVENTION

The invention is directed to a gated multi-channel amplifier which comprises a plurality of musical performance amplification channel means each responsive to high threshold level sound input for producing amplified sound output, one of the plurality of musical performance amplifier means being a vocal/announcer amplifier channel means responsive to announcer sound input of low signal level less than its high threshold level for producing an amplified announcer sound output, and means for gating the vocal/announcer amplification channel means to respond to announcer sound input of low signal level in the absence of response by the other musical performance amplification channel means.

An object of the invention is to provide a gated multi-channel amplifier system usable for ensemble musical performances wherein a vocal/announcer channel is utilized both for vocal musical input in conjunction with inputs to the other channels during an ensemble musical performance and also for announcing purposes when an ensemble musical performance is not taking place. In such a system, the vocal/announcer channel must be sensitive to a high threshold of signal input during ensemble performance and at other times it must be sensitive to conversational speech sound input of low signal level in order to pick up and amplify an announcement which is made, without being chopped up as would be the case if the high threshold were to be overcome. Any musical performance channel input threshold level must be adjusted to gate out unwanted leakage during live performance or ensemble sound levels and in consequence the adjusted threshold levels of input are so much higher than conversational speech level that none of them may be used for vocal announcement, otherwise the amplified announcement would be chopped up. The invention, then, is directed to a system including vocal/announcer channel means which is automatically switched between sensitivity to normal speech level input as necessary for announcing purposes and sensitivity to a high threshold level input as necessary for musical performances.

An object of the invention is to provide a gated multi-channel amplifier system comprising the combination of -a plurality of amplification channels, each having an audio input, an amplifier responsive to a predetermined threshold level of audio input, and threshold detector means connected to the audio input for connecting the audio input to the amplifier in response to detection of audio input exceeding the predetermined threshold level; one of the channels being a vocal/announcer amplification channel, and gating means controlled by the detector means for connecting the audio input of the vocal/announcer amplification channel to its amplifier in the absence of audio input exceeding the predetermined level of the vocal/announcer amplification channel.

Stated otherwise, an object of the invention is to utilize a NOR logic arrangement in a multiple channel amplifier system so that whereas a group of amplifier channels are always responsive to high threshold levels of audio input, a further channel is reserved for response both to high threshold level of vocal audio input and for response to low signal level of announcer audio input, with toggling of the vocal/announcer channel back and forth between low and high threshold level modes being controlled by NORing responses of the group of amplifier channels. In this way, the vocal/announcer channel is separately usable for announcements in response to low level mode speech input while the outputs of the group of channels are silent but is also usable in ensemble with one or more of the channels of the group of channels while responding to vocal input of high threshold level mode.

In another aspect, the invention is directed to a gated multi-channel amplifier system which comprises the combination of a vocal/announcer amplification channel means normally responsive to announcer sound input of low signal level for producing an amplified announcer sound output which is intelligible to an audience, musical performance amplification channel means responsive to musical sound input of high threshold level for producing amplified musical sound output, and means for rendering the vocal/announcer amplification channel means responsive only to vocal sound input of high threshold level in the presence of the amplified musical sound output.

The invention relates to a gated amplifier system comprising the combination of at least a pair of amplifier means, each having an audio input for receiving an audio input signal and an output for producing an amplified output of the audio input signal, first threshold detecting means associated with one amplifier means for detecting an audio input signal of high threshold for the one amplifier means which must be exceeded during live musical performances, second threshold detecting means associated with the other amplifier means for detecting an audio input signal of high threshold for the other amplifier means which must be exceeded during live musical performances, first gating means responsive to detection of an audio input signal of high threshold by the first threshold detecting means for passing the audio input signal of the first amplifier means for amplification, second gating means responsive to detection of an audio input signal of high threshold level by the second threshold detecting means for passing the audio input signal of the second amplifier means for amplification, and further gating means responsive to the absence of detection of audio input signal of high threshold level by the second threshold detection means for conditioning the first gating means to pass audio input signals of low signal level to the first amplifier means for amplification.

The invention also relates to a gated multi-channel amplifier system for use in connection with live musical performances and including a plurality of amplification channel means, each with its own musical sound input and means for adjusting the threshold level of sound to which the respective amplification channel means responds to a high threshold level mode wherein the threshold level is too high to respond to normal speech input, one of the amplification channel means also being responsive to low signal level of normal speech input for operation in a low signal level mode responsive to normal speech input, and means for gating the one amplification channel means to its low signal level mode and to its high threshold level mode in respective response to the absence and presence of response by any of the other amplification channel means to a high threshold level musical sound input.

The invention also relates to a gated multi-channel amplifier system which comprises a plurality of musical performance amplification channel means each responsive to high threshold level sound input for producing amplified sound output, one of the plurality of musical performance amplifier means being a vocal/announcer amplifier channel means responsive to announcer sound input of low signal level less than the high threshold level for producing an amplified announcer sound output, and means for gating the vocal/announcer amplification channel means to respond to announcer sound input only in the absence of amplified sound output produced by the other musical performance amplification channel means.

More specifically, the invention is directed to a multi-channel amplifier system comprising the combination of a first amplification channel having a sound input, a control input responsive to a control signal of one kind to produce an amplified sound output and to a control signal of another kind to gate out an amplified sound output, further amplification channels each having a sound input, a control input responsive to a control signal of one kind to produce an amplified sound output and to a control signal of another kind to gate out an amplified sound output, each of the amplification channels also having adjustable threshold level setting means for setting a high threshold level and threshold detector means connected to the sound input of the relevant amplifier channel for producing the control signal of one kind at the control input of the relevant amplifier channel when the sound input exceeds the high threshold level is detected and a control signal of the another kind when no detection takes place, and means for producing the control signal of the one kind at the control input of the first amplification channel in the presence of all control signals of the another kind produced by the further threshold detector means.

The above and other objects of the invention will become more apparent as this description proceeds.

BRIEF DESCRIPTION OF THE DRAWING FIGURES

FIG. 1 is a schematic block diagram illustrating principles of the invention; and FIG. 2 is a circuit diagram of an operative embodiment of the invention.

DETAILED DESCRIPTION OF THE INVENTION

Figure 1:
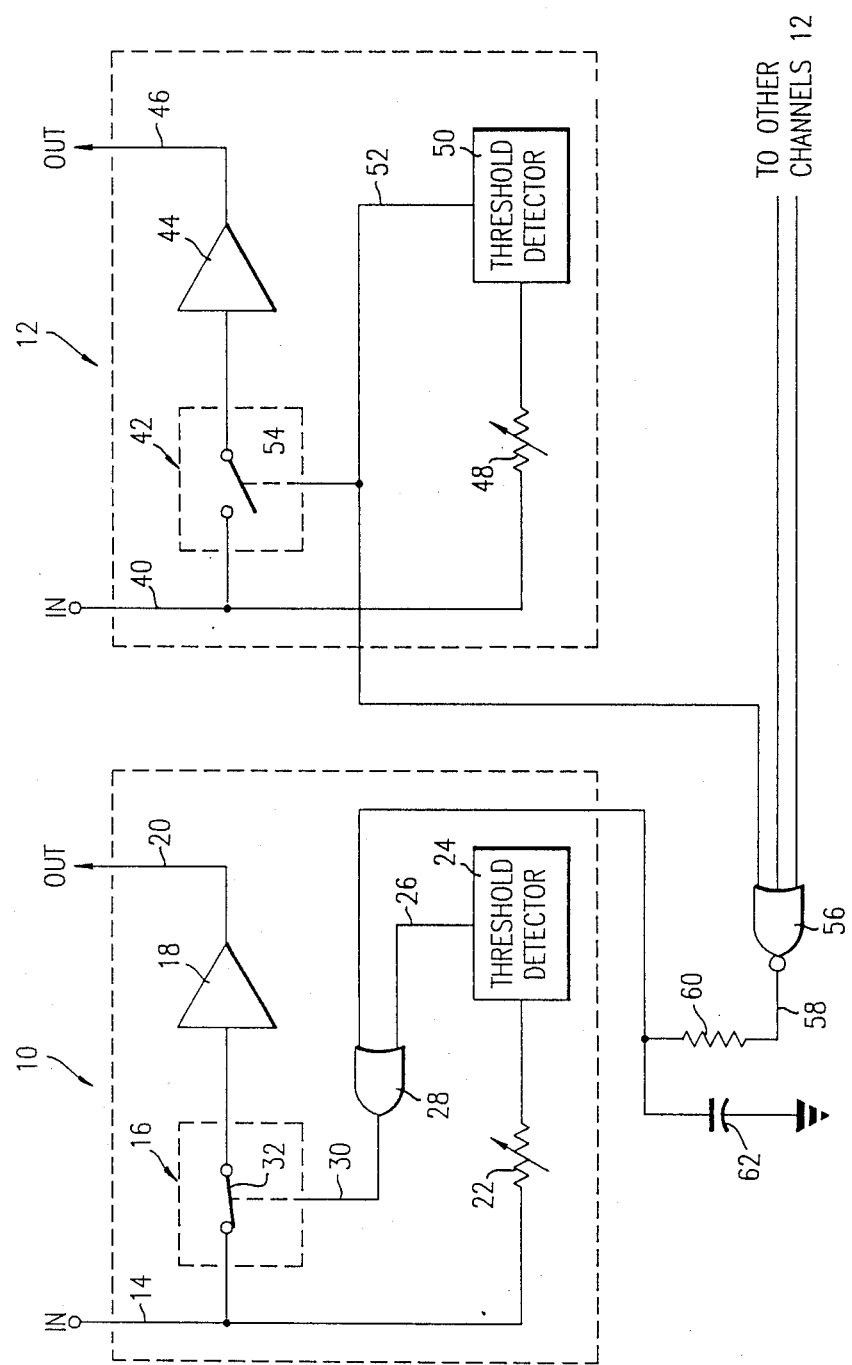

With reference at this time to FIG. 1, basic principles of the invention should be apparent therefrom. The gated multi-channel amplifier system illustrated therein incorporates a plurality of amplifier channels indicated as 10 and 12, and in which there may be more of the channels 12 if desired. The channel 10 is the vocal/announcer channel whereas the channels 12 are musical performance input channels. The channel 10 is provided with an audio input conductor 14, the off/on gating means 16, the amplifier 18 having an amplified sound signal output 20, an adjustable threshold-setting means 22, a threshold detector means 24 having a control signal output 26, and an OR gate means 28 having the control signal at 26 as one input and having an output 30 controlling the switching element 32 of the gating means 16.

Each of the channels 12 is provided with an audio input conductor 40, the off/on gating means 42, the amplifier 44 having an amplified sound signal output 46, an adjustable threshold-setting means 48, a threshold detector means 50 having a control signal output 52 which controls the switching element 54 of the gating means 42.

To complete the gated amplifier system as symbolized in FIG. 1, a NOR gating means 56 is included and which is provided with control signals as at 52 from all of the channels 12 which may be used. The output 58 of the NOR gate means 56 is connected as one input to the OR gate means 28 through the resistor 60 which, in conjunction with the grounded capacitor 62, provides delay before a change of state (e.g., from high to low) of the output of the NOR gate means is applied as an input to the OR gate means 28.

In the condition of the gating means 16 and 42 (and any others) as is illustrated in FIG. 1, the switch 32 being closed while the switch 54 is open, the low signal level mode of operation of the channel 10 is depicted. That is, since the gating means 16 is closed or on, audio input on the conductor 14 will produce an amplified output at 20. The high threshold level mode of operation for the channel 10 occurs or is effected when an audio input signal is present at 40 which exceeds the threshold set by the adjustable resistor 48 of the channel 12 shown, or in any other channel 12 which may be used, so that the corresponding control signal at 52 is high (1). Consequently, the switching element 54 of the channel 12 in question goes to on position to pass and amplify the signal at 46 and to now produce an output of the NOR gate means 56 which is low (0). This low input to the OR gate means 28 causes the output at 30 to go low and turn the gating means 16 off. This situation continues until an audio signal exceeding the threshold set by the means 22 is present at the input conductor 14 which, as a result, provides a high (1) control signal input at 26 to the OR gate means 16, thus turning the gating means 16 back on so that the high threshold audio input at 14 is amplified at 20 to join in on the ensemble with the other channel 12 or channels 12.

To reiterate, when the system is in the low signal level mode for the vocal/announcer channel 10, as in FIG. 1, an announcer or normal level speech signal at the audio input at 14 to the channel 10 will produce an amplified output at 20 of the amplifier means 18. If, however, the audio input at 40 for any or all channels 12 exceeds the threshold set by the corresponding adjustable resistor 48, the relevant detector means 50 will respond to produce a high control signal at 52. This will effect two functions, the first of which is to control the switching element 54 of the relevant gating means 42 to the closed position, opposite to that illustrated in FIG. 1, and the second of which is to condition the channel 10 for its high threshold level mode of operation because the output of the OR gate means 28 will go low to control the switching element 32 to open position, opposite to that illustrated. At this time, the channel 12 or channels 12 are producing an amplified musical sound output which, at the moment, does not include any amplified sound output from the channel 10. However, if an audio signal is present on the conductor 14 which exceeds the threshold set by the adjustable resistor 22, this is detected by the detector means 24 and the control signal at 26 goes high so that the output of the OR gate means 28 also goes high to control the switching element 32 to the closed or on position (as is shown in FIG. 1) whereby the high level audio input at the conductor 14 appears as an amplified output at 20 of the amplifier means 18.

Thus, the gated amplifier system of FIG. 1 functions to perform the basic objective of the system, namely, to provide a gated multi-channel amplifier system comprising the combination of a plurality of amplification channels, each having an audio input, an amplifier responsive to a predetermined threshold level of audio input, and threshold detector means connected to the audio input for connecting the audio input to the amplifier in response to detection of audio input exceeding the predetermined threshold level; one of the channels being a vocal/announcer amplification channel, and gating means controlled by the detector means for connecting the audio input of the vocal/announcer amplification channel to its amplifier in the absence of audio input exceeding the predetermined level of the vocal/announcer amplification channel.

Figure 2:
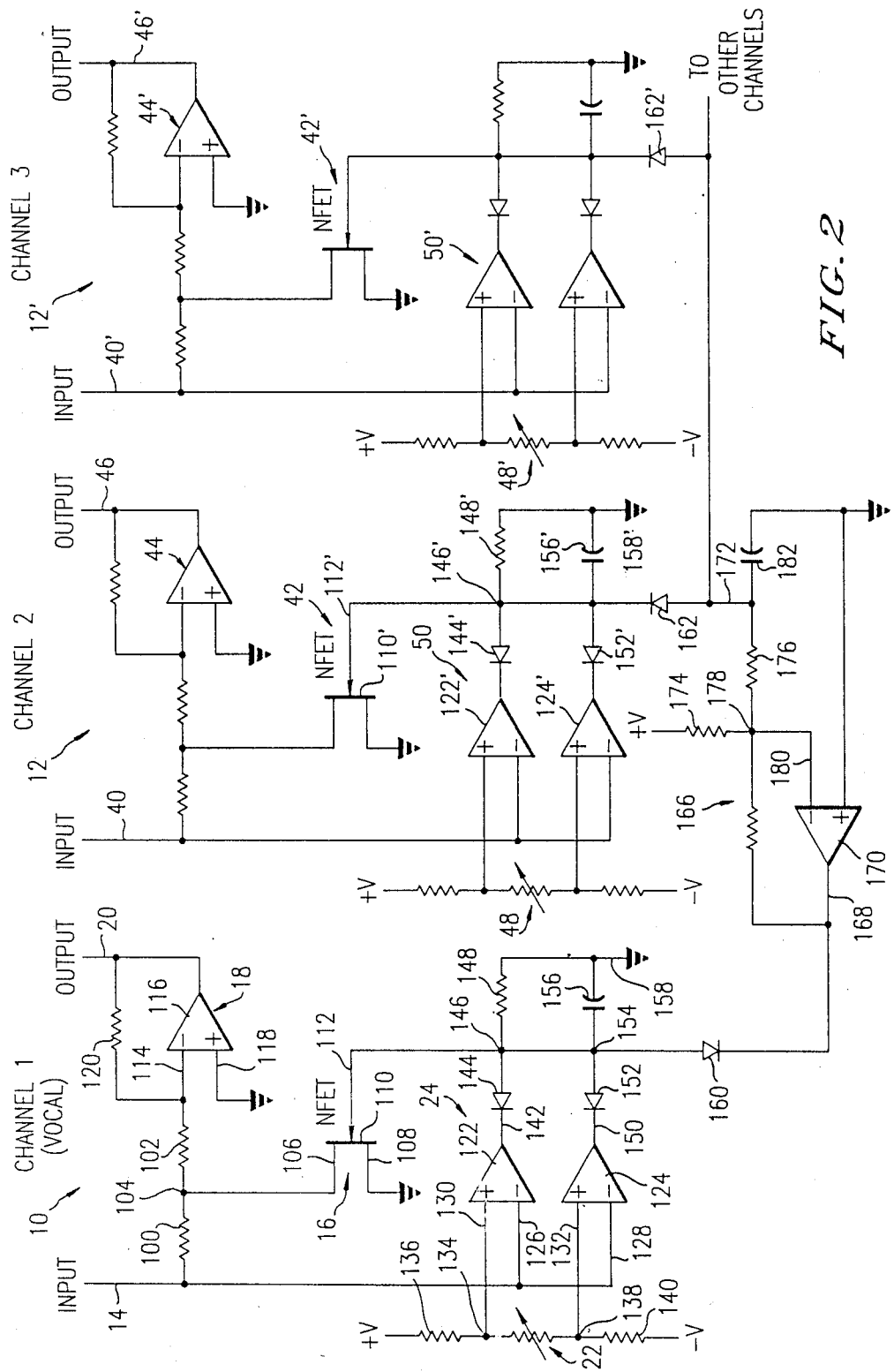

FIG. 2 illustrates a preferred embodiment of the invention. From what follows, it will be apparent that the invention may be practiced with many different configurations and need not follow the precise arrangement as in FIG. 1. It will be seen that the logical NOR function may be implemented in a somewhat different way as is the case with FIG. 2.

In FIG. 2, three channels 10, 12 and 12' are illustrated, each having its respective sound input 14, 40 or 40', using reference characters from FIG. 1 or with primed numbers where applicable. Considering first the vocal/announcer channel 10, the sound input 14 is connected to the voltage divider chain comprising the resistors 100 and 102 whose junction point 104 is shunted to ground through the drain and source electrodes 106 and 108 of the NFET transistor device 110 if its gate electrode 112 is at zero volts so that irrespective of the presence or absence of sound input signal at 14, the channel 10 cannot respond. On the other hand, if no shunt exists (i.e., the gating means 16 is open) the channel 10 may respond in its low threshold mode to an announcer sound input at 14 without attenuation. This represents the low signal level mode of operation of the channel 10 and it will be seen that the transistor 110 is now operating as the gating means 16 of FIG. 1 with the switching element 32 of FIG. 1 in the closed position shown.

The resistor chain 100, 102 is connected to the inverting input 114 of the operational amplifier 116, which may a TL072 A type, and the feedback resistor 120 is connected across the input 114 and the output 20 of the operational amplifier. The non-inverting input 118 is connected to ground as illustrated.

As noted, the source electrode 108 of the transistor 110 is connected to ground potential and its gate electrode 112 is connected to the threshold setting/detector circuit which includes a combination of the threshold setting means 22 and the detector means 24 of FIG. 1. This particular circuit in FIG. 2 includes the two operational amplifiers 122 and 124 having their respective inverting and non-inverting inputs 126 and 132 connected to the sound signal input 14 and their respective non-inverting and inverting inputs 130 and 128 are respectively connected to the junction 134 between the fixed resistor 136 and the variable resistor 22 and to the junction 138 between the adjustable resistor 22 and the fixed resistor 140.

This resistor chain, of which the resistor 22 is adjustably variable to set the high level threshold for the channel 10, is connected between the positive and negative voltage supplies +V and −V. The output 142 of the operational amplifier 122 is connected to the diode 144 which forms a junction point 146 with the resistor 148 to which the gate electrode 112 is connected whereas the output 150 of the operational amplifier 124 is connected to the diode 152 which forms a junction 154 with the capacitor 156 also connected to the gate electrode 112. The resistor 148 and the capacitor 156 are both connected to ground potential as shown at 158. The configurations of the other two channels 12 and 12' are identical with the above description of the channel 10, although in contrast with channel 10 as explained below, the channels 12, 12', etc. produce amplified outputs only when they are operating in response to high threshold level audio inputs at 40, 40', etc. and their respective shunting transistors 42, 42' turned off as a result. The channel 10 has its shunting transistor 110 turned off when channel 10 is responding to its high threshold level of audio input or when none of the other channels are responding to their high threshold level of audio input. In the FIG. 2 circuitry, the diodes 162 and 162' and the amplifier 170 combine to provide the NOR function as at 56 in FIG. 1 whereas the diodes 160, 152 and 144 combine to provide the OR function as at 28 in FIG. 1.

The gating means 166 in conjunction with the diodes 162, 162' and others if further channels are present, perform a NOR function in the sense that the output 168 of the operational amplifier 170 toggles back and forth between 0 volts and −V volts dependent upon whether the diodes 162, 164, etc. are back biased or whether one or more of them is conducting current.

When the output at 168 is at −V volts, the diode 160 conducts and the transistor 110 is off (gate means 16 open). This is the low signal level mode of operation of the amplifier channel 10.

When the output at 168 is at 0 volts, the diode 160 does not conduct and the junction point 146 is substantially at ground potential, turning the transistor 110 on so that a signal input at 14 is not amplified. This is the high threshold level mode for the channel 10 for, under this condition, an input signal level must appear at 14 which is sufficient to exceed the threshold set by the variable resistor 22 in order to turn the transistor 110 back off (junction point 146 negative) so that such high threshold level of vocal audio input at the conductor 14 is amplified to produce an amplified musical performance output at the conductor 46.

The toggling of the further gating means 166 between 0 volt and −V volt output at 168 is controlled by the channels 12, 12' etc., as stated before with reference to FIG. 1. For example, if the audio signal input at the conductor 40 exceeds the threshold set by the element 48, an operational amplifier 122', 124' will produce a sufficiently negative voltage output and at the junction point 146' to turn the transistor 110' to produce the amplified signal at 46. The diode 162 also begins conducting current through the resistor 174, which is connected to +V voltage supply, and through the resistor 176. This decreases the voltage level of the junction point 178 and thus the voltage level at the inverting input 180 of the operational amplifier 170. Consequently, the output at 168 swings toward 0 volts which back-biases the diode 160 so that the transistor 110 is turned on until vocal audio input at 14 exceeds the threshold set by the element 22.

In FIG. 2, the various capacitors 156, 156' and 182 perform the delaying functions similar to the delay capacitor 62 in FIG. 1.

In considering this invention, the above disclosure is intended to be illustrative only and the scope and coverage of the invention should be construed and determined by the following claims.

What is claimed is:

1. A gated amplifier system comprising the combination of at least a pair of amplifier means, each having an audio input for receiving an audio input signal and an output for producing an amplified output of the audio input signal, first threshold detecting means associated with a first amplifier means for detecting only an audio input signal of high threshold for the first amplifier means which must be exceeded during live musical performances to produce a second output from said first amplifier, second threshold detecting means associated with a second amplifier means for detecting only an audio input signal of high threshold for the second amplifier means which must be exceeded when said first amplification means detects an audio signal exceeding said high threshold to produce a sound output from said second amplifier means, first gating means responsive to detection of an audio input signal of high threshold by the first threshold detecting means for passing the audio input signal of the first amplifier means for amplification, second gating means responsive to detection of an audio input signal of high threshold level by the second threshold detecting means for passing the audio input signal of the second amplifier means for amplification, and further gating means responsive to the absence of detection of audio input signal of high threshold level by the first threshold detection means for conditioning the second gating means to pass audio input signals of low signal level to the second amplifier means for amplification.

2. A gated multi-channel amplifier system for use in connection with live musical performances and including a first plurality of amplification channel means, each with its own musical sound input means, threshold controlled gating means, and threshold means for defining a high signal level mode wherein the threshold level of sound input required to turn on the respective amplification channel means is too high for the respective amplification channel means to respond to normal speech input, said plurality of amplification channel means responding to audio in only said high signal level mode, another amplification channel means which can function in said high signal level mode, and which can also function in a low signal level mode in which the threshold level of sound input is low enough to respond to normal speech input, and means for setting said another amplification channel means to its low signal level mode and to its high signal level mode in respective response to the absence or presence of response by any of the first plurality of amplification channel means to a respective audio input which actuates the respective amplification channel means in said high signal level mode.

3. A gated multi-channel amplifier system which comprises a plurality of musical performance amplification channel means each responsive only to high threshold level sound input for producing high level amplified sound output, there also being a vocal/announcer amplifier channel means responsive to high threshold level sound input and also to announcer sound input of low signal level less than the high threshold level for producing a low level amplified announcer sound output, and means for setting the vocal/announcer amplification channel means to respond to announcer sound input of the low signal level only in the absence of any amplified sound output produced by any of the plurality of musical performance amplification channel means.

4. In a multi-channel amplification system as defined in claim 3 wherein the means for setting includes a delay circuit.

5. A gated multi-channel amplifier system, comprising a plurality of musical performance amplification channel means in which the amplification channel means comprises a vocal/announcer channel and at least one musical performance input channel, the vocal/announcer channel comprising an audio input conductor, an amplifier having an amplified sound signal output, a gating means for selectively connecting and disconnecting the audio input conductor to the amplifier, a threshold detector means for producing a control signal output in response only to a high threshold of audio input on the audio input conductor, and an OR function gate means having the control signal output of the threshold detector means as one input and having a gate output for controlling the gating means to on condition when an input to the OR function gate means is present;

the musical performance input channel comprising an audio input conductor, an amplifier having an amplified sound signal output, a gating means for selectively connecting and disconnecting the audio input conductor of the musical performance input channel to the amplifier of the musical performance input channel, and a threshold detector means for producing a control signal output in response only to a high threshold of audio input on the audio input conductor of the musical performance input channel for controlling the gating means of the musical performance input channel to on condition; and a NOR function gating means having the control signal output of the threshold detector means of the musical performance input channel as an input and having a NOR output for producing an input to said OR function gate means for allowing all of the channels to operate at the same time under high threshold conditions or for allowing only the vocal/announcer channel to operate under a low threshold condition which is lower than any said high threshold conditions.

6. A gated amplifier system as defined in claim 5 including a plurality of said musical performance input channels, each having a control signal output as a separate input to said NOR function gating means.

7. A gated amplifier system as defined in claim 6 wherein said NOR function gating means comprises a plurality of diodes.

8. A gated amplifier system as defined in claim 7 wherein said OR function gate means comprises a plurality of diodes.

9. A gated multi-channel amplifier system comprising the first and second non-identical audio input channels, the first channel comprising a first audio input conductor, a first gate and a first amplifier connected in series to said first audio input conductor, a first manually adjustable resistor and a first threshold detector connected in parallel with the series connection of said first gate and said first amplifier, OR gate means for controlling said first gate to closed condition in response to output by said OR gate means and having the output of the first threshold detector as an input thereto, and NOR gate means for also providing an input to said OR gate means;

said second channel comprising a second audio input conductor, a second gate and a second amplifier connected in series to said second audio input conductor, a second manually adjustable resistor and a second threshold detector connected in parallel with the series connection of said second gate and said second amplifier, said second threshold detector having its output connected as an input to said NOR gate means whereby a first audio signal of a high enough level to trigger the first threshold detector through said first manually adjustable resistor in combination with a second audio signal of a high enough level to trigger said second threshold detector through said second manually adjustable resistor will produce amplifier musical sound for the multi-channel system whereas a third audio signal which is an announcer sound of low enough level so as not to trigger the first threshold detector, in the absence of triggering of the second threshold detector, will trigger the NOR gate means to produce an amplified announcer sound.

10. A gated multi-channel amplifier system as defined in claim 9 including a third audio input channel identical with the second channel, the threshold detector of the third channel having an output which is connected as an input to said NOR gate means.

11. A gate multi-channel amplifier system as defined in claim 10 wherein said NOR gate means comprises a diode connected to each of the outputs of the threshold detectors of said second and third channels.

12. A gated multi-channel amplifier system as defined in claim 11 wherein said OR gate means comprises a pair of operational amplifiers having said first manually adjustable resistor and said first audio input conductor as inputs thereto and a plurality of diodes connected between the operational amplifiers, said first gate and said NOR gate means.

* * * * *

UNITED STATES PATENT AND TRADEMARK OFFICE
CERTIFICATE OF CORRECTION

PATENT NO. : 4,953,222
DATED : August 28, 1990
INVENTOR(S) : John H. Roberts

It is certified that error appears in the above-identified patent and that said Letters Patent is hereby corrected as shown below:

Column 7:
At claim 1, line 15, delete "second" and insert --sound--.

Column 10:
At claim 11, line 11, delete "gate" and insert --gated--.

Signed and Sealed this

Third Day of December, 1991

Attest:

HARRY F. MANBECK, JR.

*Attesting Officer*     *Commissioner of Patents and Trademarks*